United States Patent [19]

Bateman

[11] Patent Number: 4,830,953

[45] Date of Patent: * May 16, 1989

[54] RADIATION-SENSITIVE COATING COMPOSITION WITH POLYAZIDE AND POLYIMIDE AND PROCESS OF PHOTO-CROSSLINKING THE COATING

[75] Inventor: John H. Bateman, West Nyack, N.Y.

[73] Assignee: Ciba-Geigy Corporation, Ardsley, N.Y.

[*] Notice: The portion of the term of this patent subsequent to Apr. 7, 2004 has been disclaimed.

[21] Appl. No.: 48,986

[22] Filed: May 11, 1987

Related U.S. Application Data

[63] Continuation of Ser. No. 898,792, Aug. 18, 1986, abandoned, which is a continuation of Ser. No. 810,831, Dec. 19, 1985, abandoned, which is a continuation of Ser. No. 722,996, Apr. 15, 1985, abandoned, which is a continuation of Ser. No. 486,652, Apr. 20, 1983, abandoned.

[51] Int. Cl.$^4$ .................. G03C 1/71; G03C 1/60; G03F 7/26

[52] U.S. Cl. .................. 430/197; 430/194; 430/306; 430/325; 430/330; 522/65; 522/136; 522/137; 522/164

[58] Field of Search .............. 430/197, 194, 330, 270, 430/927, 281, 325, 306; 522/164, 65, 136, 137

[56] References Cited

U.S. PATENT DOCUMENTS

| | | | |
|---|---|---|---|
| 3,708,458 | 1/1973 | Alberino et al. | 528/353 |
| 3,787,367 | 1/1974 | Farrissay et al. | 528/67 |
| 3,856,752 | 12/1974 | Bateman | 528/353 |
| 3,870,677 | 3/1975 | Farrissey et al. | 528/353 |
| 4,092,442 | 5/1978 | Agnihotri et al. | 430/330 |
| 4,197,133 | 4/1980 | Zweifel et al. | 430/197 |
| 4,242,437 | 12/1980 | Rohloff | 430/270 |
| 4,243,743 | 1/1981 | Hiramoto et al. | 430/281 |
| 4,287,294 | 9/1981 | Rubner et al. | 430/306 |
| 4,331,705 | 5/1982 | Samudrala | 427/54.1 |
| 4,383,903 | 5/1983 | Augano et al. | 430/197 |
| 4,451,551 | 5/1984 | Kataoka et al. | 430/285 |
| 4,656,116 | 4/1987 | Rohde et al. | 430/197 |

FOREIGN PATENT DOCUMENTS

| | | | |
|---|---|---|---|
| 65352 | 11/1982 | European Pat. Off. | |
| 56-24344 | 6/1980 | Japan | 430/197 |

OTHER PUBLICATIONS

Chemical Abstracts, vol. 95, #159904f, 1981.
Mittal, K. L. "Polyimides", vol. 2, v–vii (pvcfoce), 1984.
Ahne, H. et al., "Polyimide Patterns Made Directly from Photopolymers", *Polyimides*, vol. 2, p. 905–918, 1984, (from paper given 11/1982).
Kataoka et al., *Polyimides*, "Characteristics of a Highly Photoreactive Polyimide Precursor", pp. 933–945, vol. 2, (1984), Mittal, K. L. (Ed.).
Merrem et al., *Polyimides*, New Developments in Photosensitive Polyimides, pp. 919–931, vol. 2, (1984), Mittal, K. L. (Ed.).

*Primary Examiner*—Charles L. Bowers, Jr.
*Attorney, Agent, or Firm*—Harry Falber

[57] ABSTRACT

Polyimides which contain aliphatic groups can be radiation-crosslinked with chromophoric aromatic polyazides. Solutions in organic solvents can be used as radiation-sensitive coating agents for preparing insulating or protective coatings and as photoresists having high thermal, mechanical and chemical stability.

21 Claims, No Drawings

RADIATION-SENSITIVE COATING COMPOSITION WITH POLYAZIDE AND POLYIMIDE AND PROCESS OF PHOTO-CROSSLINKING THE COATING

This application is a continuation of application Ser. No. 898,792, filed Aug. 18, 1986, now abandoned, which is a continuation of Ser. No. 810,831, filed Dec. 19, 1985, now abandoned, which is a continuation of application Ser. No. 722,996, filed Apr. 15, 1985, now abandoned, which is a continuation of Ser. No. 486,652, filed Apr. 20, 1983, now abandoned.

The present invention relates to a radiation-sensitive coating agent which consists of a polyimide dissolved in an organic solvent and an organic polyazide, to a photographic recording material, and to the use of the coating agent for applying insulating or protective coatings, in particular in the manufacture of printed circuits, discrete semiconductor components and integrated circuits.

Polyimides have good thermal stability, and they are therefore also used in electronics and semiconductor technology as insulating or protective films or for the photographic preparation of relief images. Since polyimides are generally insoluble in organic solvents, it is necessary to proceed from soluble precursors which carry radiation-sensitive groups or are mixed with radiation-sensitive compounds. The polyimide is formed here only after imaging, namely by thermal cyclisation, in the course of which a considerable amount of volatile substances is removed. On heating the relief structures generated in the imaging suffer a considerable loss in thickness and a marked contraction in the vertical dimensions. This is thought of as particularly unfavourable, because it has proved remarkably difficult to generate full-scale images of a given mask. Also, the technically complicated preparation of the precursors is uneconomical. In addition, the various additives prevent the polyimides thus prepared from exhibiting the good electrical, mechanical and thermal properties characteristic of these polymers. German Offenlegungsschrift No. 2,308,830 and German Offenlegungsschrift No. 2,914,619, for example, describe such precursors.

Direct crosslinking by high-energy radiation and hence the possibility of photostructuring polyimides directly is extremely desirable to prevent the disadvantages mentioned. It is an object of the present invention to provide a coating agent with which polyimides can be directly radiation-crosslinked.

We have now found that polyimides can be directly radiation-crosslinked with chromophoric aromatic polyazides if the polyimides contain aliphatic groups.

The present invention relates to a radiation-sensitive coating agent comprising (a) an organic solvent, (b) a homopoly-imide or copolyimide which is soluble in said solvent and is formed from aromatic tetracarboxylic acid, dianhydrides and aromatic diamines or aromatic-/aliphatic diamines or diisocyanate derivatives of said amines, where at least one aliphatic group is bonded directly or via a bridging group to at least one of the tetracarboxylic acid radicals to at least one of the aromatic diamine radicals, or to both radicals or at least one of said tetracarboxylic acid or aromatic diamine radicals contains an alkylene, alkylidene, cycloalkylidene or Si(alkyl)$_2$ aliphatic bridging group and (c) at least 0.1% by weight, based on component (b), of at least one organic chromophoric polyazide in which the azide groups are bonded to aromatic hydrocarbon radicals.

The radicals with aliphatic groups and/or bridging groups preferably contain at least 5 mol %, in particular at least 10 mol % and especially at least 30 mol % in the polyimide or copolyimide, based on the polyimide. The aliphatic groups are preferably bonded to aromatic radicals, and the bridging groups link aromatic radicals, in particular 2 phenyl groups.

The aliphatic group preferably has the formula alkyl-Q—where there are 1-6, in particular 1-3, C atoms in the alkyl group and where Q is a direct bond, —O—, —S—, —SO—, —SO$_2$—, —CO—, —NH—, —N-alkyl having 1-6, preferably 1-3, C atoms, or —NHCO—. Examples of alkyl are methyl, ethyl, propyl, isopropyl, 1-butyl, 2-butyl, tertiary-butyl, 1-, 2- or 3-pentyl and hexyl. Ethyl and in particular methyl are preferred. The aliphatic group is particularly preferably methyl or methoxy.

The aliphatic bridging group is as alkylene preferably ethylene or in particular methylene, as alkylidene ethylidene, 1,1- or 2,2-propylidene or 1,1- or 2,2-butylidene, as cycloalkylidene cyclopentylidene or cyclohexylidene and as Si(alkyl)$_2$ Si(methyl)$_2$ or Si(ethyl)$_2$. The bridging group is preferably methylene, 2,2-propylidene or Si(methyl)$_2$.

The aliphatic groups and aliphatic bridging groups are preferably contained in the diamine radical. The copolyimides can be random polymers or block copolymers. Radicals of aliphatic diamines contained in the copolyimides are preferably present in an amount of at most 20 mol %, in particular at most 10 mol %, based on the diamines.

Polyimides and copolyimides which are suitable for use in the coating agent of the invention have been described in the literature, can be obtained by similar methods or are commercially available.

U.S. Pat. No. 3,856,752, for example, describes a group of suitable polyimides. They essentially consist of recurring structural units of the formula I,

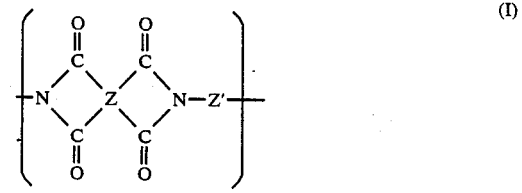

in which the four carbonyl groups are bonded to different carbon atoms and any two carbonyl groups are in ortho- or peri-position relative to each other, Z is a tetravalent radical which contains at least one aromatic ring and Z' is a divalent organic radical selected from among aromatic, alkylaromatic, aliphatic, cycloaliphatic and heterocyclic radicals, combinations thereof and radicals having oxygen-, sulfur-, nitrogen-, silicon- or phosphorus-containing bridging groups, with the proviso that (1) of the total number of recurring polyimide units
(A) in 0 to 100 mol % of such units Z is a phenylindane radical of the structural formula

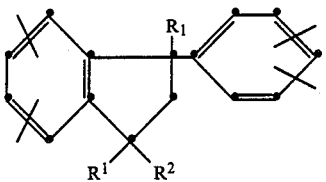

(II)

in which $R_1$ is hydrogen or an alkyl radical having 1 to 5 carbon atoms and $R_2$ is an alkyl radical having 1 to 5 carbon atoms, and (P) in 0 to 100 mol % of such units Z' is a phenylindane radical of the structural formula

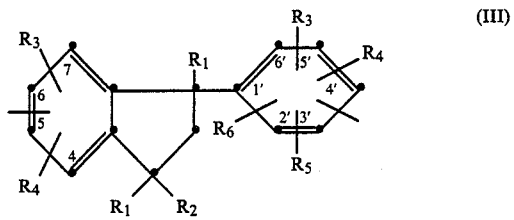

(III)

in which $R_1$ is hydrogen or an alkyl radical having 1 to 5 carbon atoms, $R_2$ is an alkyl radical having 1 to 5 carbon atoms, and $R_3$, $R_4$, $R_5$ and $R_6$ independently of one another are hydrogen, halogen, alkoxy or an alkyl radical having 1 to 4 carbon atoms and (2) of the total number of radicals Z and Z' at least 10 mol %, based on the individual components, are phenylindane radicals.

$R^2$ in the formulae II and III is preferably methyl. The degree of polymerisation (number of recurring structural units) is preferably at least 20, and can amount to 1,000 or more. The degree of polymerisation is particularly preferably 50 to 500, in particular 100 to 300.

Alkyl $R_1$ and $R_2$ can be methyl, ethyl, propyl, isopropyl, butyl or pentyl. $R_1$ is particularly preferably hydrogen or methyl and $R_2$ methyl.

Halogen $R_3$, $R_4$, $R_5$ and $R_6$ are preferably chlorine or bromine. Examples of alkoxy radicals $R_3$, $R_4$, $R_5$ and $R_6$ are butoxy, propoxy, ethoxy and in particular methoxy, while examples of alkyl radicals $R_3$, $R_4$, $R_5$ and $R_6$ are butyl, tertiary-butyl, propyl, iso-propyl, ethyl and in particular methyl. $R_3$, $R_4$, $R_5$ and $R_6$ are particularly preferably hydrogen, methyl or chlorine.

The phenylindanediamine component of the soluble polyimide can consist of any combination of isomeric or substituted isomeric diamino compounds which are represented by the above formula III. For example, the phenylindanediamine component can embrace 0 to 100 mol % of 5-amino-1-(4'-aminophenyl)-1,3,3-trimethylindane in a combination with 100 to 0 mol % of 6-amino-1-(4'-aminophenyl)-1,3,3-trimethylindane. Moreover, each or both of these isomers can be substituted via the diamino isomers which are represented by the formula III. Examples of such substituted diamino isomers are 5-amino-6-methyl-1-(3'-amino-4'-methylphenyl)-1,3,3-trimethylindane, 5-amino-1-(4'-amino-Ar', Ar'-dichlorophenyl)-Ar,Ar-dichloro-1,3,3-trimethylindane, 6-amino-1-(4'-amino-Ar',Ar'-dichlorophenyl)Ar,Ar-dichloro-1,3,3-trimethylindane, 4-amino-6-methyl-1-(3'-amino-4'-methylphenyl)-1,3,3-trimethylindane and Ar-amino-1-(Ar'-amino-2',4'-dimethylphenyl)-1,3,3,4,6-pentamethylindane. Ar and Ar' in the above formulae indicate the undefined position in the phenyl rings of the relevant substituents. The amino groups are preferably in the 7-, in particular 5- or 6-, position and in the 3'- and in particular the 4'-position.

Examples of the phenylindanedianhydride component having a radical of the formula II are 1-(3',4'-dicarboxyphenyl)-1,3,3-trimethylindane-5,6-dicarboxylic dianhydride, 1-(3',4'-dicarboxyphenyl)-1,3,3-trimethylindane-6,7-dicarboxylic dianhydride, 1-(3',4'-dicarboxyphenyl)-3-methylindane-5,6-dicarboxylic dianhydride and 1-(3',4'-dicarboxyphenyl)-3-methylindane-6,7-dicarboxylic dianhydride.

A non-phenylindane radical Z in the formula I can be selected from among the following groups: aromatic, aliphatic, cycloaliphatic and heterocyclic groups, and combinations of aromatic and aliphatic groups. The groups can also be substituted. The groups Z can be characterised by the following structures:

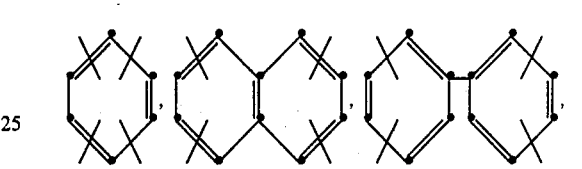

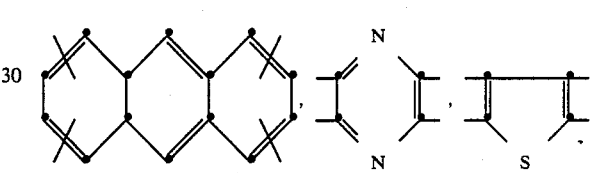

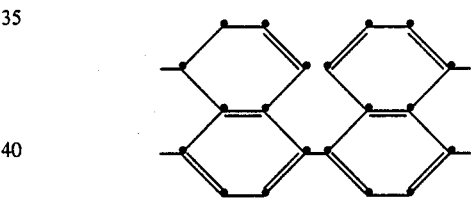

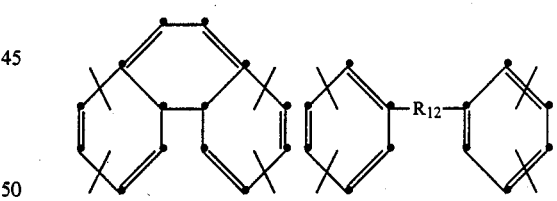

in which $R_{12}$ is selected from the group consisting of

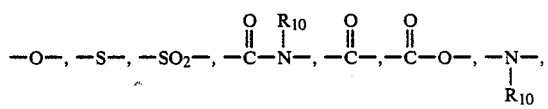

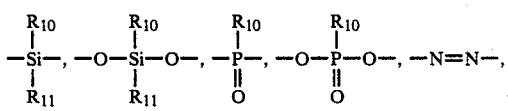

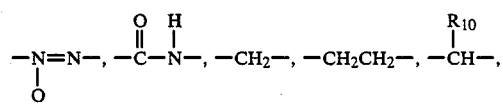

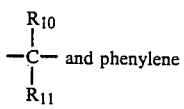

where $R_{10}$ and $R_{11}$ are alkyl having preferably 1 to 6 C atoms or aryl, in particular phenyl.

Examples of suitable tetracarboxylic anhydrides having a tetravalent radical Z are 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronapthalene-1,4,5,8-tetracarboxylic dianhydride, phenanthrene-1,8,9,10-tetracarboxylic dianhydride, 2,3,3',4'-benzophenonetetracarboxylic dianhydride, pyromellitic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 4,4'-isopropylidenediphthalic anhydride, 3,3'-isopropylidenediphthalic anhydride, 4,4'-hydroxydiphthalic anhydride, 4,4'-sulfonyldiphthalic anhydride, 3,3'-hydroxydiphthalic anhydride, 4,4'-methylenediphthalic anhydride, 4,4'-thiodiphthalic anhydride, 4,4'-ethylidenediphthalic anhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzole-1,2,3,4-tetracarboxylic dianhydride, pyrazine-2,3,5,6-tetracarboxylic dianhydride, thiophene-2,3,4,5-tetracarboxylic dianhydride and dianhydrides of the general formula

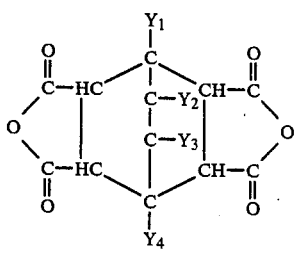

in which each of $Y_1$, $Y_2$, $Y_3$ and $Y_4$ is selected from among hydrogen and alkyl, in particular methyl.

The most preferred non-phenylindane aromatic dianhydrides, characterised by the general formula

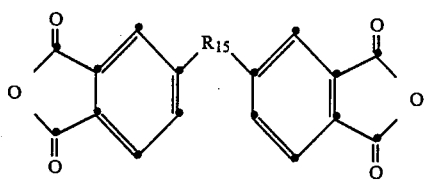

in which $R_{15}$ is methylene, oxygen, sulfonyl or in particular carbonyl.

The group Z' defined above can be selected from among alkylene groups having 2 to 12 carbon atoms, cycloalkylene groups having 4 to 6 ring carbon atoms, a xylylene group, arylene groups selected from among ortho-, meta- or para-phenylene, tolylene, biphenylene, naphthylene and anthrylene, a substituted arylene group of the formula

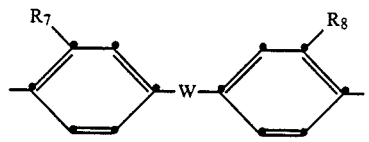

in which W is a covalent bond, sulfur, carbonyl, —NH, —N-alkyl, O, S, SS, —N-phenyl, sulfonyl, a linear or branched alkylene group having 1 to 3 carbon atoms, alkylidene having 2 to 12 C atoms, cycloalkylidene having 5 or 6 ring carbon atoms, arylene, in particular the phenylene group, or a dialkylsilyl or diarylsilyl group, and $R_7$ and $R_8$ independently of each other are hydrogen, halogen, in particular chlorine or bromine, alkyl having 1 to 5 carbon atoms, in particular, methyl, alkoxy having 1 to 5 carbon atoms, in particular methoxy, or aryl, in particular phenyl.

The group Z' can also have the formula

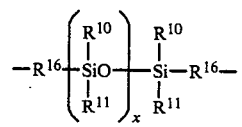

in which $R^{10}$ and $R^{11}$ are as defined above and $R^{16}$ is a divalent hydrocarbon radical, for example alkylene having 1 to 12, preferably 1 to 6 C atoms, cycloalkylene having preferably 5 or 6 ring carbon atoms or phenylene. U.S. Pat. No. 4,030,948 describes diamines which have this group Z'.

It is more preferable for Z' to be groups which are derived from those aromatic diamines described in the immediately preceding paragraph. Z' is most preferably a group of the formula

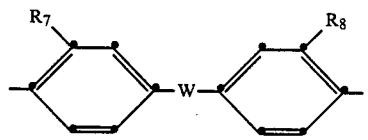

in which W is a covalent bond, methylene, sulfur, oxygen or sulfone, and $R_7$ and $R_8$ independently of each other are hydrogen, halogen, or alkyl having 1 to 5 carbon atoms, in particular methyl, or a group of the formula

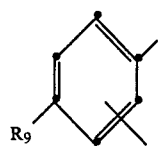

in which $R_9$ is hydrogen, halogen, or alkyl having 1 to 5 carbon atoms, in particular methyl.

Z' is particularly preferably meta- or para-phenylene or a radical of the formula

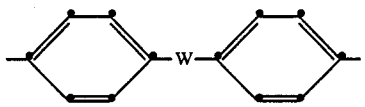

in which W is a covalent bond, methylene, alkylidene, 2,2-propylidene, cyclohexylidene, sulfur, oxygen or sulfone.

Examples of diamines having a divalent radical Z' are 4,4'-methylenebis-(o-chloroaniline), 3,3'-dichlorobenzidine, 3,3'-sulfonyldianiline, 4,4'-diaminobenzophenone, 1,5-diaminonaphthalene, bis-(4-aminophenyl)-dimethylsilane, bis-(4-aminophenyl)-diethylsilane, bis-(4-aminophenyl)-diphenylsilane, bis-(4-aminophenyloxy)-dimethylsilane, bis-(4-aminophenyl)-ethylphosphine oxide, N-[bis-(4aminophenyl)]-N-methylamine, N-[bis-(4-aminophenyl)]-N-phenylamine, 4,4'-methylenebis-(3-methylaniline), 4,4'-methylenebis-(2-ethylaniline), 4,4'-methylenebis-(2-methoxyaniline), 5,5'-methylenebis-(2-aminophenol), 4,4'-methylenebis-(2-methylaniline), 4,4'-hydroxybis-(2-methoxyaniline), 4,4'-hydroxybis-(2-chloroaniline), 5,5'-hydroxybis-(2-aminophenol), 4,4'-thiobis-(2-methylaniline), 4,4'-thiobis-(2-methoxyaniline), 4,4'-thiobis-(2-chloroaniline), 4,4'-sulfonylbis-(2-methylaniline), 4,4'-sulfonylbis-(2-ethoxyaniline), 4,4'-sulfonylbis-(2-chloroaniline), 5,5'-sulfonylbis-(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-hydroxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine and diaminotoluene.

A preferred sub-group of soluble polyimides includes those in which 0 to 100 mol % of the radicals Z have the formula

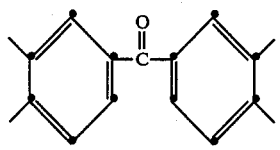

or the formula

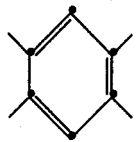

while 100 0 mol % of the radicals Z are a mixture of

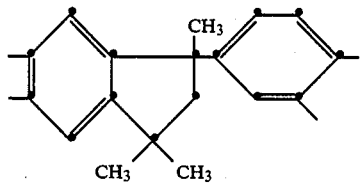

and

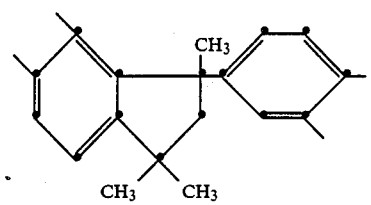

and 100 to 10 mol % of the radicals Z' are a radical of the formula III in which $R_1$, $R_3$, $R_4$, $R_5$ and $R_6$ independently of one another are hydrogen or methyl and $R_2$ is methyl, while 0 to 90 mol % of the radicals Z' have the formula

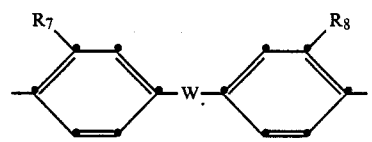

or

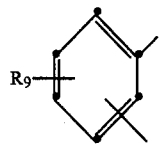

in which W is a covalent bond, methylene, ethylidene, 2,2-propylidene, cyclohexylidene, sulfur, oxygen or sulfone, $R_7$ and $R_8$ independently of each other are hydrogen, halogen, alkoxy or alkyl groups having 1 to 5 carbon atoms, and $R_9$ is hydrogen, halogen, alkoxy or an alkyl group having 1 to 5 carbon atoms.

Those polyimides are particularly preferred in which Z' is

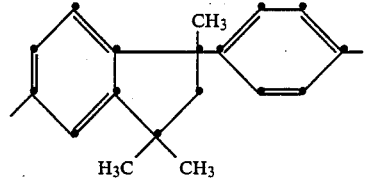

or

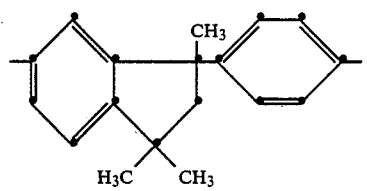

or

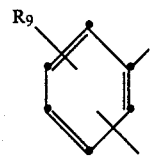

or one of the mixtures thereof and Z is

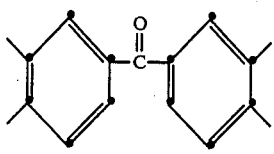

or

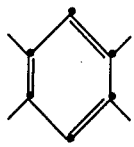

or a mixture thereof.

Other polyimides are copolyimides of the formula I having non-phenylindane radicals are also suitable. They can be composed of the abovementioned, other tetracarboxylic acids and diamines, at least some of the diamines containing aliphatic groups or bridging groups. The choice of components and of their mixing ratios can have a marked influence on the solubility. Various methods have been disclosed of obtaining soluble polyimides and copolyimides. Such polyimides, which contain aliphatic groups in the diamine radicals have been described, for example, in J. of Applied Polymer Science, Vol. 26, 3837–3843 (1981) and in F. W. Harris and L. H. Garnier, Structure-Solubility Relationships in Polymers, Academic Press, New York, Pages 183–198 (1977). Homopolyimides and copolyimides preferred for the coating agent of the invention are described in U.S. Pat. Nos. 3,708,458, 3,787,367 and 3,870,677 and in German Auslegeschrift No. 1,962,588. Of these particularly those are preferred which consist of radicals of benzophenonetetracarboxylic anhydride and/or pyromellitic dianhydride and, based on the diamine radicals, of 65–90 mol % of radicals of toluenediamine in a mixture with 35 to 10 mol % of 4,4'-diaminodiphenylmethane, or of radicals of 2,2'- or 3,3'-dimethyl-, diethyl-, or dimethoxy-4,4'-diaminodiphenylmethane.

Another preferred group of homopolyimides and copolyimides comprises those which essentially consist of recurring structural units of the formula I in which the four carbonyl groups are bonded to different carbon atoms and any two carbonyl groups are in ortho- or peri-position relative to each other, Z is a tetravalent radical which contains at least one aromatic ring and Z' is a divalent organic radical selected from among aromatic, alkylaromatic aliphatic, cycloaliphatic and heterocyclic, radicals, combinations thereof and radicals having oxygen-, sulfur-, nitrogen-, silicon-, or phosphorus-containing bridging groups, with the proviso that of the total number of recurring polyimide units, based on the tetracarboxylic anhydride radicals or diamine radicals, (A) 30–100 mol % of such units Z are benzophenonetetracarboxylic radicals and (B) 30–100 mol % of such units Z' are radicals of the formulae

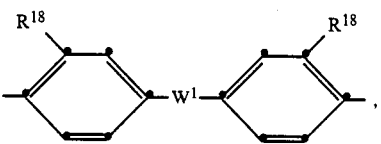

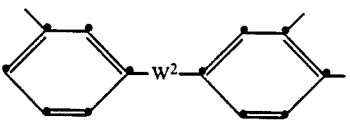

or

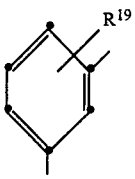

in which $W^1$ is $CH_2$, O, S, $SO_2$, CO or

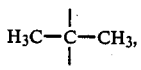

$W^2$ is $CH_2$, S, $SO_2$, CO or

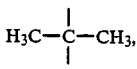

$R^{18}$ is alkyl or alkoxy having 1 to 6 C atoms, halogen, in particular Cl, $CO_2H$, OH, $SO_3H$ or $NHCOCH_3$ and $R^{19}$ is alkyl having 1 to 6 C atoms, at least 10 mol % of these radicals being those which have $CH_2$,

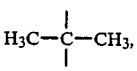

alkyl, alkoxy or $NHCOCH_3$ groups.

Preferably $R^{18}$ and $R^{19}$ are methyl and $W^1$ and $W^2$ $CH_2$.

A further suitable group of homopolyimides and copolyimides are those which consist of recurring structural units of the formula I in which, based on the tetracarboxylic anhydride radicals or diamine radicals, (A) 75 to 100 mol % of the units Z are a pyromellitic anhydride radical and (B) 25 to 0 mol % of the units have the formula

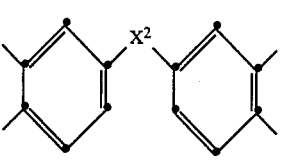

in which $X^2$ is O, $SO_2$ or, in particular CO, and (C) 10 to 35 mol % of the units Z' have the formula

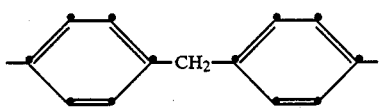

and 90 to 65 mol % of the units Z' have the formulae

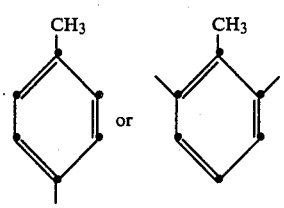

or mixtures thereof.

Likewise particularly suitable copolyimides are those which consist of recurring structural units of the formula I in which
(A) Z is a benzophenonetetracarboxylic dianhydride radical and
(B) based on the diamine radicals, 10–30 mol % of the units Z' have the formula

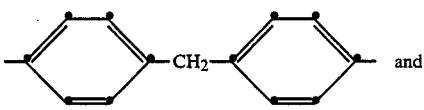 and (C) 90–70 mol % of the units Z' have the formulae

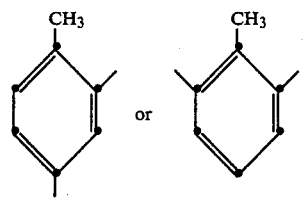

or mixtures thereof.

Those polyimides are preferred which have a high thermostability. Those polyimides are particularly preferred which do not decompose at a temperature $\leq 350°$ C. in air. It is also known that for polymeric materials to give good photostructuring they should have a very narrow molecular weight distribution. It has been found to be very advantageous to pretreat the soluble polyimides by means of known separating methods, such as fractional precipitation, to obtain coating agents which have a narrow molecular weight distribution. It is also known that the radiation sensitivity increases with the average molecular weight $\overline{M}_w$. An average weight of 10,000 to 500,000, preferably 30,000 to 300,000, in particular 30,000 to 200,000, has been found to be favourable.

Suitable organic solvents are polar, in particular polar aprotic solvents which can be used alone or in mixtures of at least two solvents. Examples of suitable solvents are ethers, such as dibutyl ether, tetrahydrofuran, dioxane, methylethylene glycol, dimethylethylene glycol, dimethyldiethylene glycol, diethyldiethylene glycol, and dimethyltriethylene glycol, halogenated hydrocarbons, such as methylene chloride, chloroform, 1,2-dichloroethane, 1,1,2-trichloroethane, and 1,1,2,2-tetrachloroethane, carboxylates and lactones, such as ethyl acetate, methyl propionate, ethyl benzoate, 2-methoxyethyl acetate, γ-butyrolactone, δ-valerolactene and mevalolactone, carboxamides and lactams, such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethyl urea and hexamethylphosphoramide, sulfoxides such as dimethyl sulfoxide, sulfones, such as dimethyl sulfone, diethyl sulfone, trimethylene sulfone, tetramethylene sulfone, primary, secondary and tertiary amines, such as methylamine, ethylamine, propylamine, pyrrolidine, piperidine, morpholine, dimethylamine, diethylamine, methylethylamine, trimethylamine, triethylamine, N-methylpyrrolidine, N-methylpiperidine, and N-methylmorpholine, and substituted benzenes such as chlorobenzene, nitrobenzene and cresol.

The polyazides (b) are known, and have been described, for example in European Patent Application No. 0,065,352. They can be used alone or in any desired mixtures.

The aromatic hydrocarbon radicals of the chromophoric polyazides (c) can be substituted by 1 or 2 halogen groups, in particular chlorine, and alkoxy or alkyl groups having 1 to 5 C atoms. Organic chromophoric diazides, in particular those without imide groups, are preferable. These can be diazides of the formula $$N_3-D-N_3$$

in which D is arylene, such as phenylene, naphthylene, toluylene or perylene.

More preferable is a group of organic diazides of the formula $$N_3-E-(Y)_q-E-N_3,$$

in which E is an aromatic hydrocarbon radical, in particular phenylene, q is 0 or 1, and Y is an inorganic or organic group which forms a mesomeric system together with the aromatic hydrocarbon radicals E. Y is preferably O, CO, S, SO, SO$_2$, NR' in which R' is hydrogen, alkyl, cycloalkyl aryl or aralkyl,

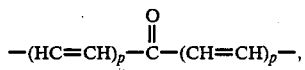

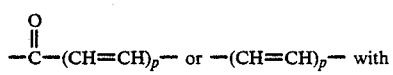

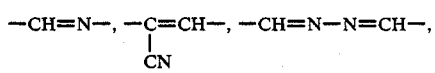

−CH=N⟨⟩⟨⟩N=CH−, (―CH=CH)_q―CH=C(R″)―C(=O)―C(R‴)=CH(―CH=CH)_q,

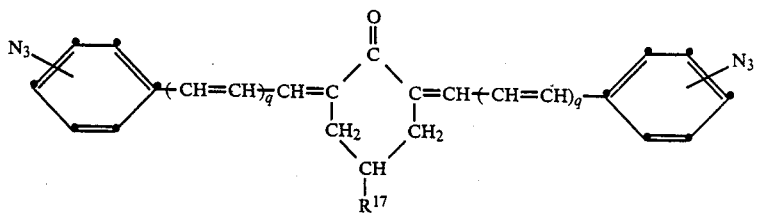

in which R″ and R‴ independently of each other are alkyl having 1 to 5 C atoms or R″ and R‴ together are unsubstituted or alkyl-, hydroxyalkyl-, alkoxy-, trialkylsilyl-, hydroxyl-, carboxyl-, alkoxycarbonyl-, amino-, alkylamino-, or dialkylamino-substituted ethylene or trimethylene, q is 0 or 1, $X^1$ is O, S or NH, $Y^1$ is independently defined in the same way as Y and free bonds on N and $Y_1$ form a fused heterocyclic ring together with the group E. $Y^1$ is preferably a direct bond or —CH=CH—.

R′ as alkyl preferably contains 1 to 6 C atoms, as cycloalkyl preferably 5 or 6 ring carbon atoms, as aryl preferably 6 to 12 C atoms and as aralkyl preferably 7 to 14 C atoms. Suitable substituents for the ethylene or trimethylene group are preferably alkyl having 1-6 C atoms, in particular methyl or ethyl, hydroxyalkyl having 1 to 6 C atoms, in particular hydroxymethyl, alkoxy having 1 to 6 C atoms, in particular methoxy or ethoxy, alkoxycarbonyl having 1 to 12, in particular 1 to 6, C atoms, such as methoxycarbonyl or ethoxycarbonyl, alkylamino and dialkylamino having 1 to 6 C atoms in the alkyl group, such as dimethylamino, and trialkylsilyl having 1 to 6 C atoms in the alkyl group, such as trimethylsilyl.

A preferred sub-group are diazidesd of the formula

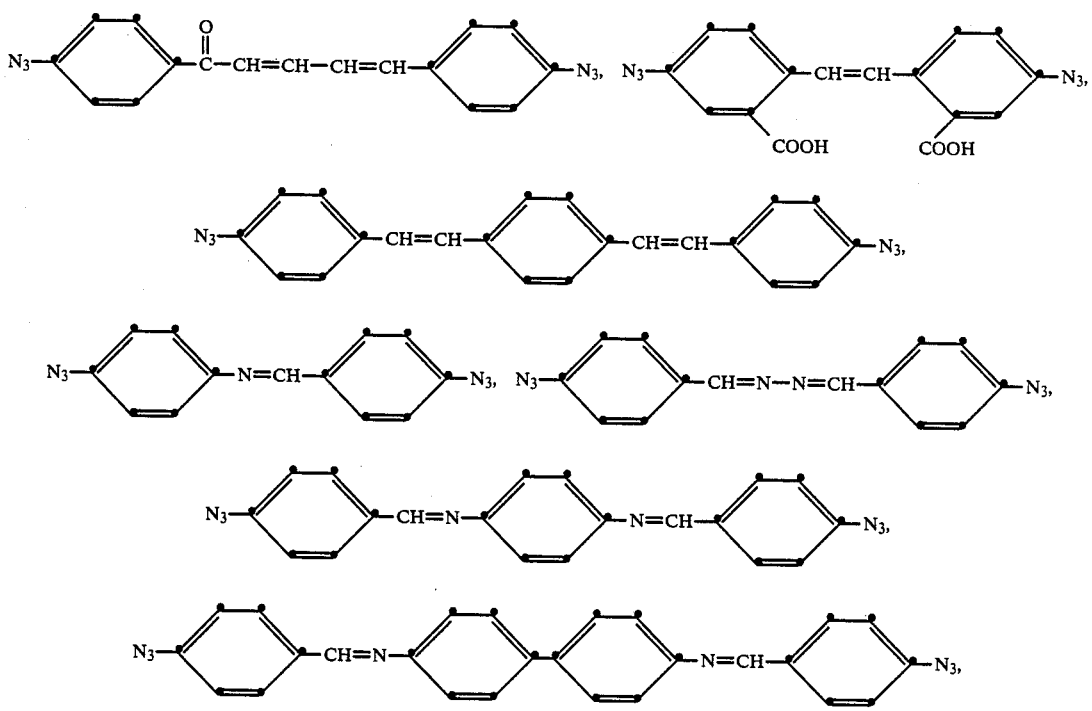

in which the azido groups are preferably bonded in the p-position, q is 0 or 1, and $R^{17}$ is OH, COOH, $NH_2$, alkyl, hydroxyalkyl, alkoxycarbonyl, trialkylsilyl, alkylamino, or dialkylamino, The preferred definitions for $R^{17}$ are listed above.

Examples of polyazides are diazidobenzene, diazidonaphthalene, diazidotoluene, p-diazidobiphenylene, 4,4′-diazido-2,2-dimethylbiphenylene, 4,4′-bisazidodiphenyl ether, 4,4′-bisazidodiphenyl ketone, 4,4′-bisazidodiphenyl sulfone, 3,3′-bisazidodiphenyl sulfide, 4,4′-bisazidodiphenylamine, 1,2-bis-(4-azidophenyl)ethylene, 1-cyano-1,2-bis-(4-azidophenyl)ethylene, 4-azidophenyl-(4-azidophenylvinyl)ketone, bis-(4-azidophenylvinyl)ketone, 1,4-bis-(4-azidophenyl)butadiene and those of the formulae -continued
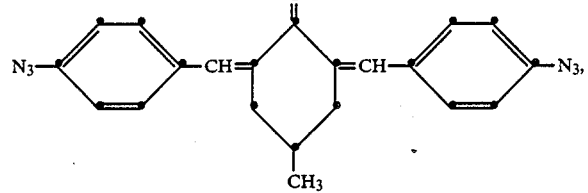
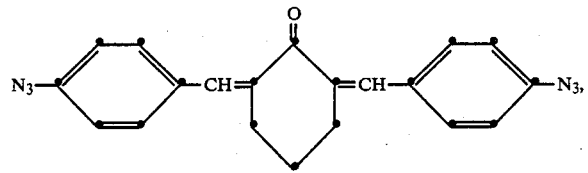
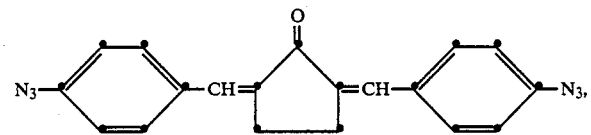
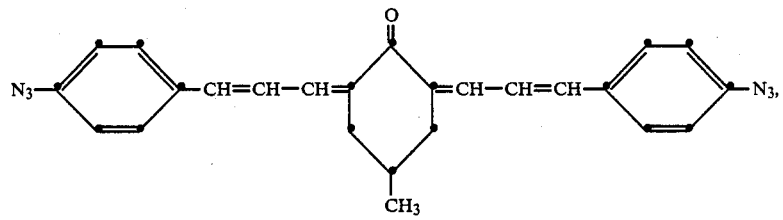
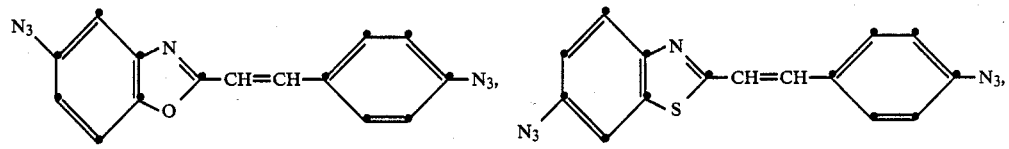
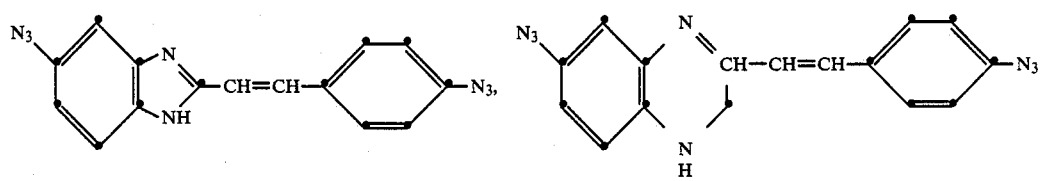
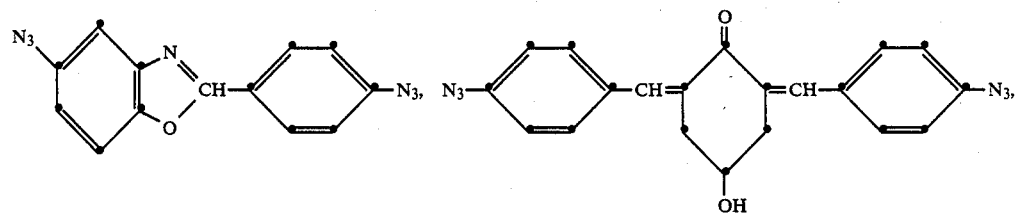
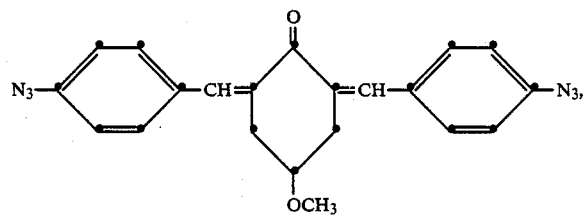

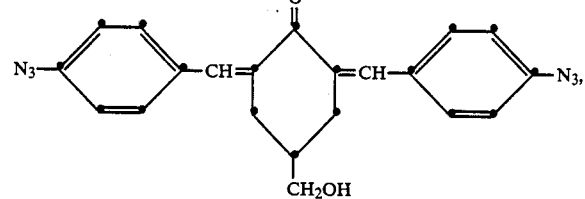
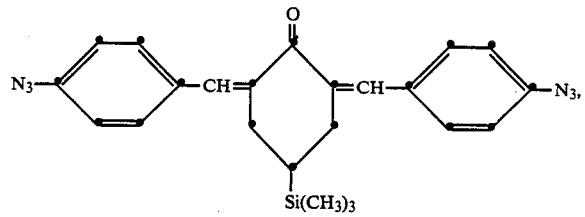
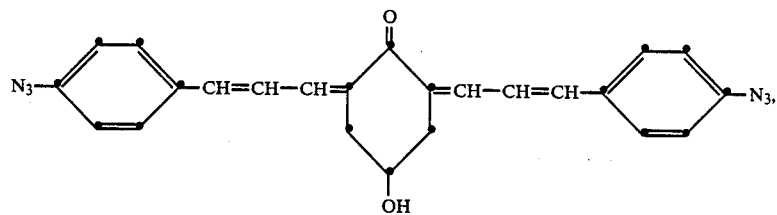
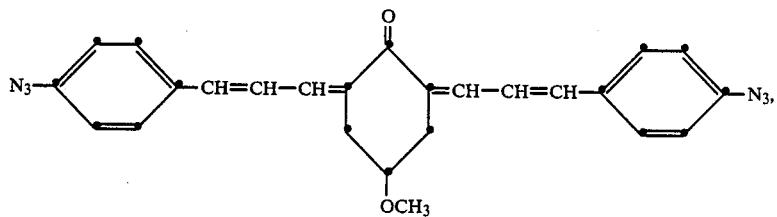
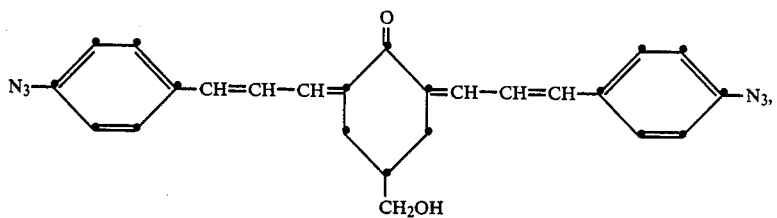
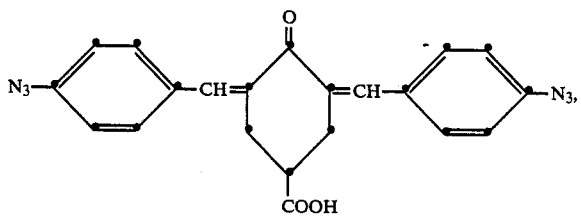
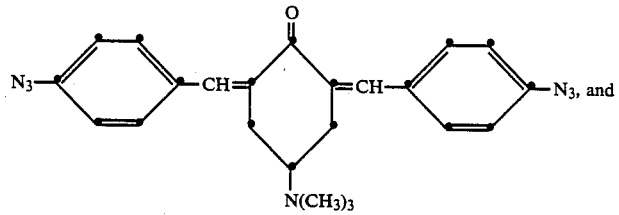

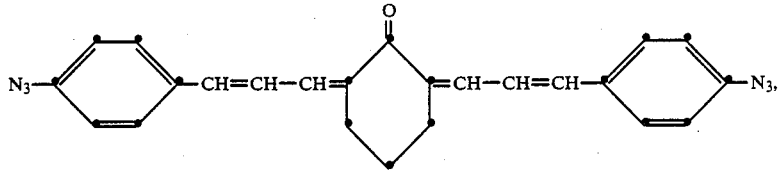

The coating agents of the invention are prepared by dissolving the components in organic solvents. This is conveniently done by first completely dissolving the polyimide with heating and then admixing the bisazide, if appropriate with slight heating. Undissolved portions can be removed by filtration, preferably pressure filtration.

The quantitative composition of the coating agent of the invention essentially depends on the desired application. It can amount to 80 to 99.9, preferably 85 to 99.9 and in particular 90 to 97, % by weight of polyimide (b) and 20 to 0.1, preferably 15 to 0.1 and in particular 10 to 3, % by weight of bisazide (c), preferably not more than 50% by weight, in particular not more than 30% by weight, and especially not more than 20% by weight, of polyimide (b) and bisazide (c) being dissolved in the solvent (a), based on the solution.

The photostructuring or photocrosslinking can be effected with high-energy radiation, for example, by light within the 600–200 nm region, by X-rays, laser light, electron beams and the like, in particular by light within the 450–300 $\mu$m region.

The coating agents can have incorporated customary additives which have no adverse effect on the light-sensitivity. Examples of such additives are sensitisers, delustrants, flow-control agents finely divided fillers, flame-retardants, fluorescent brighteners, antioxidants, photostabilisers, stabilisers, dyes, pigments and tackifiers.

It is also possible to add compounds which can increase the sensitivity of aromatic polyazides. Preferred compounds of this type are described in, for example, Photographic Science and Engineering, Vol. 17, Number 4, pages 390 et seq. (1973). Examples are anthrone, 1,9-benzanthrone, acridine, cyanoacridine, nitropyrene, 1,8-dinitropyrene, Michler's ketone, 5-nitroacenaphthene, 2-nitrofluorenone, 1,2-benzanthraquinone, and 2-chloro-1,8-phthaloylnaphthalene. Such compounds can be used alone or in a mixture. The compounds added can also be dyes which can reduce the adverse influence which reflected scattered light has on the resolving power (anti-halation agents). Such compounds have been described, for example, in U.S. Pat. No. 4,349,619.

The light-sensitive coating agent of the invention is a viscous liquid which has a long shelflife but needs to be protected from light and heat. It is particularly suitable for preparing protective and passivating coatings in electrical engineering and electronics and for use as a photographic recording material, for example, for preparing photomasks in electronics, textile printing and the graphic trades.

The light-sensitive layer can be applied to suitable substrates or carrier materials by means of customary methods, such as dipping, brushing, spraying, whirler-coating, cascade-coating or curtain-coating. Examples of suitable substrates are plastics, metals, metal alloys, semi-metals, semi-conductors, glass and ceramic and other inorganic materials, for example, $SiO_2$ or $Si_3N_4$.

The solvent is then removed by heating, if appropriate, in vacuo. This gives tack-free, dry and even films. The films, which are up to about 15 $\mu$m, preferably up to 5 $\mu$m and especially up to 2 $\mu$m, thick, are then crosslinked by exposure to light and then completely hardened, if appropriate in a heat-treatment. This gives, for example for integrated circuits, protective films which have excellent adhesion and high thermal, mechanical and chemical stability.

As is known, bisazide photocrosslinking is inhibited by atmospheric oxygen, in particular in thin layers. This effect can be avoided by means of customary methods, such as the application of a temporary protective layer of, for example, polyvinyl alcohol, by working under an inert gas or by vacuum contact with the photomask. It is also possible to add compounds which suppress the influence of oxygen. Such compounds are described in U.S. Pat. No. 3,479,185.

The coating agent of the invention is also highly suitable for preparing a photographic recording material for relief images. The present invention also relates to such a recording material comprising a carrier or substrate to which a mixture of polyimide (b) and of bisazide (c) has been applied as light-sensitive layer. The light-sensitive layer can be up to 15 $\mu$m, in particular up to 5 $\mu$m and especially up to 2 $\mu$m thick.

In the photographic recording material, the light-sensitive layer can be used as, for example, an etch resist in the manufacture of printed circuits, printing plates or integrated circuits, a relay in the preparation of X-ray masks, a soldering resist, a dielectric material for multilayer circuits or a structural element for liquid crystal displays.

The relief structure is photographically generated by imagewise exposure through a photomask followed by developing to remove the unexposed parts with a solvent or a solvent mixture, whereupon, if desired, the image generated can be stabilised by a thermal aftertreatment.

The coating agent of the invention has various further advantages. Subsequent imide formation as in the existing light-sensitive compositions is avoided. The good film-forming properties give even coatings which on exposure and thermal aftertreatment suffer virtually no loss in thickness. The solutions also have a long shelflife, and the images generated adhere very firmly to the substrates.

The examples which follow illustrate the invention in more detail.

(A) Preparation of polyimides

The polyimides are prepared in a manner described in U.S. Pat. No. 3,856,752, namely by reacting the corresponding dianhydrides and diamines in N-methylpyrrolidone (NMP) and then imidating the resulting polyamidic acids with acetic anhydride.

The corresponding higher molecular weight polymers are then obtained by dissolving the resulting polymers in a solvent (NMP, 4-butyrolactone, dimethylformamide or CHCl₃) and subjecting the solution to fractional precipitation with a non-solvent (toluene, xylene or ethanol). Such or similar methods of separating polymers have been described, for example, in D. Braun et al. Praktikum der Makromolecularen Chemie, (Practical Macromolecular Chemistry), Dr. Alfred Hütig Verlag, 1971, pages 95 et seq.

The polymers are characterised by the inherent viscosity (($\eta_{inh}$)0.5% solutions in NMP at 25° C.).

The average molecular weights ($\overline{M}_w$) are also determined, depending on the solubility in THF either by gelpermeation chromatography and/or by means of a light-scattering measurement.

The gelpermeation chromatograms are recorded with an instrument supplied by Waters GmbH using a set of columns consisting of $2\times10^6$Å, $2\times10^5$Å, $2\times10^4$Å, $2\times10^3$Å, and $1\times500$ Å, which are calibrated by means of polystyrene standards of defined molecular weights within the range 40 to $10^7$.

For determining the average molecular weight by light-scattering a KMX-6 instrument supplied by Chromatix is used, 633 nm laser light doing the exciting and forward scattering being measured between the angles of 6° and 7°.

Preparation Example 1

20 g of a polyimide prepared from benzophenonetetracarboxylic dianhydride (BTDA) and 5(6)-amino-1-(4'-aminophenyl)-1,3,3-trimethylindane are dissolved in 1,200 g of 4-butyrolactone, the solution is filtered, and toluene is slowly added at 25° C. to the filtrate. In the toluene to 4-butyrolactone range between 2.3:1 and 8:1, 7 fractions for the different molecular weights are isolated, of which 6 are not only highly soluble but also have good filterability.

TABLE 1

| Polyimide | Result of a fractional precipitation | | | |
|---|---|---|---|---|
| | Amount (g) | $\overline{M}_w$ | $\eta_{inh}$ | Ratio of precipitating agent to solvent. |
| Starting material | 20 | 58,000 | 0.68 | 2.324 |
| Fraction 1 | 1.60 | 372,000 | 1.29 | 2.474 |
| Fraction 2 | 2.41 | 184,000 | 0.90 | 2.658 |
| Fraction 3 | 2.48 | 110.400 | 0.72 | 2.874 |
| Fraction 4 | 2.48 | 72,600 | 0.58 | 3.124 |
| Fraction 5 | 2.25 | 57,400 | 0.50 | 3.445 |
| Fraction 6 | 5.13 | 41,700 | 0.41 | 4.445 |
| Fraction 7 | 2.69 | 27,800 | 0.32 | 7.345 |

Solvent: 4-butyrolactone
Precipitating agent: toluene

Preparation Example 2

20 g of a polymer prepared from benzophenonetetracarboxylic dianhydride and a mixture of 80 mol percent of 5(6)-amino-1-(4'-aminophenyl)-1,3,3-trimethylindane and 20 mol percent of toluenediamine (TDA) are dissolved in 1,100 g of 4-butyrolactone, and toluene is slowly added at 25° C. In the toluene to 4-butyrolactone range between 1.2:1 and 4.0:1, the 5 fractions isolated differ in molecular weight, are highly soluble and have good filterability.

Preparation Example 3

20 g of a polymer prepared from benzophenonetetracarboxylic dianhydride (BTDA), 80 mol percent of toluenediamine and 20 mol percent of 4,4'-diaminodiphenylmethane and having ($\eta_{inh}$=0.56, $\overline{M}_w$=35,000) are dissolved in 2,500 g of 4-butyrolactone, the solution is filtered, and toluene is slowly added to the filtrate. In the toluene to 4-butyrolactone range between 0.33:1 and 1.3:1, the 3 fractions isolated have the following properties:

Fraction 1 (4.53 g): soluble in NMP, insoluble in 4-butyrolactone, not filterable Fraction 2 (3.979): rapidly soluble in NMP, slowly soluble in 4-butyrolactone, readily filterable ($\overline{M}_w$=77,000)

Fraction 3 (10.10 g): readily soluble in NMP and 4-butyrolactone, readily filterable Use Examples (A) Preparation of coating agents and coated substrates In these examples, each additive concentration is based on the mass of the dissolved polymer. If the concentration of a solution is stated, it has been calculated only from the quantities of polymer and of solvent.

Example 1

4.88 g of a polymer prepared from benzophenonetetracarboxylic dianhydride and 5(6)-amino-1-(4'-aminophenyl)-1,3,3-trimethylindane and having a molecular weight of 144,000 are admixed with 43.12 g of 4-butyrolactone and dissolved overnight by shaking. At 23° C. the solution has a viscosity of 641 mPas. It is admixed with 293 mg (6%) of 2,6-bis(4-azidobenzylidene)-4-methylcyclohexanone and further diluted with 9.41 g of 4-butyrolactone. The solution is then filtered under 3 bar of pressure through a 0.45 μm filter. The solution then has a viscosity of 228 mPas.

Using the solution to whirler-coat SiO₂-coated silicon wafers in the course of 20 seconds requires a speed of 1,750 r.p.m. to prepare a 1 μm thick film.

Example 2

1.04 g of a polymer prepared from benzophenonetetracarboxylic dianhydride and 5(6)-amino-1-(4'-aminophenyl)-1,3,3-trimethylindane and having a molecular weight of 184,000 is admixed with 10.52 g of 4-butyrolactone and dissolved overnight by shaking.

The solution has a viscosity of 351 mPas. 73 mg (7.0%) of 2,6-bis(4-azidobenzylidene)-4-methylcyclohexanone are then dissolved therein, and the solution is then filtered under 3 bar of pressure through a 0.2 μm filter. A 1 μm thick film is obtained on silicon wafers at a whirler speed of 2,500 r.p.m.

(B) Photostructuring on coated substrates

The substrates used are 3-inch silicon wafers coated with 0.1 μm of SiO₂. Each of them is whirler-coated for 20 seconds at a speed between 1,000 r.p.m. and 6,000 r.p.m. To ensure comparable measurements, the viscosities of the solutions and the speed of rotation are chosen in such a way that in each case approximately 1 μm thick films are formed.

The light-sensitive coatings are dried at 40° to 80° C. for 5 to 30 minutes in a circulating air cabinet.

They are subjected to exposure in a mask-adjusting and exposure machine supplied by Karl Süss under a light output of 30 mw/cm² as measured with an intensity meter from Optical Associates Inc. The data relate to the 365 nm probe. Use is made of a black chromium mask which contains test patterns of any geometrical shape customary in semiconductor manufacture, namely sized 1 μm, 2 μm, 3 μm ... 10 μm, 20 μm ... 100 μm. Although crisp image structures can be generated even in exposure times which are much shorter than those indicated below, only those times are given here where there is an exact 1:1 reproduction of all geometrical figures equal to or greater than 4 times the film thickness (equality of grooves and ridges).

Developing takes place in a spray developer under 2 bar of pressure at speeds between 500 and 2,000 r.p.m., and requires between 2 and 20 seconds.

A profilometer supplied by Tencor (Alpha-Step) is used to measure the film thickness.

Example 3

An 8.5% solution in 4-butyrolactone is prepared of a polyimide prepared from benzophenonetetracarboxylic dianhydride and 5(6)-amino-1-(4'-aminophenyl)-1,3,3-trimethylindane and having an average molecular weight $\overline{M}_w$ of 144,000. The solution is admixed with 6% of 2,6-bis-(p-azidobenzylidene)-4-methylcyclohexanone (bisazide No. 1), and filtered, and the filtrate is whirler-coated onto $SiO_2$-coated 3-inch wafers at 1,750 r.p.m. in the course of 20 seconds. The wafers are predried at 60° C. for 20 minutes in a circulating air cabinet. They are then subjected to vacuum-contact exposure for 65 seconds under an additional supply of $N_2$ gas. Developing takes place according to the following programme:

(Spray-developing under 2 bar at 1,000 r.p.m.):
Methylene chloride/toluene (68:32): 8 seconds
Methylene chloride/toluene (34:66): 3 seconds
Toluene: 10 seconds Any structure of 5 μm or more is crisp and reproduced in a ratio of 1:1 (ridges and grooves). The film thickness is 1.02 μm.

The coated wafers are then placed in an oven, are heated in the course of one hour at 400° C. in an atmosphere of nitrogen, are left at 400° C. for 15 minutes and are then cooled down.

On inspection with a high-resolution microscope there are not visible changes in structure. The renewed measurement of the film thickness gives a value of 0.96 μm.

The coated wafers are exposed in an ultrasonic bath for 10 minutes to hot NMP at 80° C. The structures are found to be inert to this treatment.

Example 4

The 8.5% polyimide solution of Example 3 is admixed with 5.77% of 2,6-bis-(p-azidobenzylidene)-cyclohexanone (bisazide No. 2), and filtered, and the filtrate is whirler-coated, again at 1,750 r.p.m. in the course of 20 seconds, onto $SiO_2$-coated 3-inch wafers. They are exposed and developed according to the same programme as in Example 3.

Again an exposure time of 65 seconds is required to give crisp structures sized 5 μm or greater.

Example 5

The 8.5% polymer solution of Example 3 is admixed with 6% of bis-(4-azidophenyl ketone). The image structures are prepared as described in Example 3. Exposure is necessary for 320 seconds to give crisp structures.

Example 6

A 9% solution in 4-butyrolactone is prepared of a polymer prepared from benzophenonetetracarboxylic dianhydride and 5(6)-amino-1-(4'-aminophenyl)-1,3,3-trimethylindane and having an average molecular weight of 184,000, 7% of bisazide No. 1 are added to the solution, and the mixture is filtered.

An $SiO_2$-coated wafer is whirler-coated at 6,000 r.p.m. in the course of 20 seconds, the coatings are dried at 60° C. for 10 minutes, and the wafer is then subjected to vacuum-contact exposure. Developing takes place as follows:

Methylene chloride/toluene 68:32: 3 seconds
Methylene chloride/toluene 34:66: 3 seconds
Toluene: 10 seconds An exposure time of only 16 seconds is necessary to produce crisply resolved structures. Even 2 μm structures are sharply resolved. The film thickness is 0.38 μm and, after heating at 400° C. in an $N_2$ atmosphere, is 0.35 μm.

Example 7

An 8.7% solution in 4-butyrolactone is prepared of a polymer prepared from benzophenonetetracarboxylic dianhydride, 80 mol percent of 5(6)-amino-1-(4'-aminophenyl)-1,3,3-trimethylindane and 20 mol percent of diaminotoluene and having a molecular weight of 95,000, and 7% of bisazide No. 1 are added.

The filtered solution is whirler-coated at 1,800 r.p.m. onto a wafer and exposed for 120 seconds.

Developing takes place according to the programme:
Methylene chloride/toluene 80:20: 8 seconds
Methylene chloride/toluene 40:60: 3 seconds
Toluene: 10 seconds This gives crisp structures having a film thickness of 0.97 μm and a resolution of 4 μm.

The film thickness is 0.91 μm after heating at 400° C.

Example 8

A 9% solution in 4-butyrolactone is prepared of a polymer prepared from pyromellitic dianhydride (PMDA) and 5(6)-amino-1-(4'-aminophenyl)-1,3,3-trimethylindane and having a molecular weight of 60,000 and of bisazide No. 1, and is whirler-coated at 1,700 r.p.m. onto 3-inch wafers.

Vacuum-contact exposure for 200 seconds is followed by the following development programme:
Methylene chloride/toluene 65:35: 8 seconds
Methylene chloride/toluene 32:68: 3 seconds
Toluene: 10 seconds There are crisp relief structures in the central part of the wafer. However, the structures of the outlying parts of the wafer (outer third of the radius) are underexposed.

The relief structures of the central parts have a film thickness of 0.92 μm. On heating to 400° C. the film thickness is 0.75 μm.

Example 9

Coated wafers of the type described in Example 8 receive an additional, thin polyvinyl alcohol layer which is spun on at 4,500 r.p.m. in the form of a solution of the following composition:

Polyvinyl alcohol (Mowiol 488, Hoechst): 5%
Alkylphenol polyethylene glycol (Triton X-100, Röhm and Haas): 0.05%
Water: 94.95%

The thickness of the polyvinyl alcohol film is 0.1 μm.
The wafers are subjected to exposure for 220 seconds, sprayed with hot water, dried and developed as in Example 8.

In contrast to the result in Example 8, this time the wafers are covered over the entire area with uniformly exposed relief structures.

Example 10

A 9.0% solution in 4-butyrolactone is prepared of a polymer prepared from benzophenonetetracarboxylic dianhydride and 5(6)-amino-1-(4'-aminophenyl)-1,3,3-trimethylindane and having an average molecular weight of 184,000, is admixed with 7% of 2,6-bis-(4-azidobenzylidene)-4-methylcyclohexan-1-one and filtered through 0.2 μm. The filtrate is whirler-coated at 2,500 r.p.m. in the course of 20 seconds onto $SiO_2$-coated 3-inch wafers and dried thereon at 60° for 20 minutes in a circulating air cabinet. The wafers are subjected to vacuum-contact exposure for 52 seconds through a black chromium mask and then developed according to the following programme (spray developer, 2 bar pressure, 1,000 r.p.m.):

Methylene chloride/toluene 68:32: 10 seconds
Methylene chloride/toluene 34:66: 3 seconds
Toluene: 10 seconds The resulting crisp relief structures have a thickness of 1.05 μm and a resolutin of 5 μm in which all grooves and ridges are exactly reproduced in a ratio of 1:1.

Heat-treating the wafers in an oven at 400° C. under nitrogen gives no structural changes and the film thickness is then 1.00 μm.

Example 11

A 7% filtered solution in 4-butyrolactone is prepared of a polymer prepared from benzophenonetetracarboxylic dianhydride, 80 mol percent of 5(6)-amino-1-(4'-aminophenyl)-1,3,3-trimethylindane and 20 mol percent of toluenediamine and having a molecular weight of 174,000, and contains 7% of 2,6-bis(4-azidobenzylidene)-4-methylcyclohexanone. The solution is whirler-coated at 1,250 r.p.m. onto a 3-inch wafer, dried at 60° C. for 20 minutes in a circulating air cabinet and subjected to a 70 second vacuum-contact exposure.

The developing programme in a spray developer under 2 bar of pressures at 1,000 r.p.m. is as follows:

Methylene chloride/toluene 80:20: 8 seconds
Methylene chloride/toluene 40:60: 3 seconds
Toluene: 10 seconds The crisply reproduced relief structures have a film thickness of 0.98 μm and a resolution of 4 μm.

Even some of the 3 μm structures are sharply resolved. On heating to 400° C. under nitrogen the final film thickness is 0.92 μm.

Example 12

A polyimide prepared from benzophenonetetracarboxylic dianhydride, 80 mol% of toluenediamine and 20 mol% of 4,4'-diaminodiphenylmethane ($\overline{M}_w=35,000$) is dissolved in 4-butyrolactone, and the solution is admixed with 7% of bisazide No. 1 and filtered. The 10% solution has a viscosity of 374 mPas. Whirler-coating at 3,400 r.p.m. and drying for 20 minutes is followed by a 150 second vacuumcontact exposure. This gives structures which have a film thickness of 0.93 μm. On heating to 400° C. the film thickness is 0.73 μm.

Example 13

Polymer fraction 2 of Preparation Example 3 (where $\overline{M}_w=77,000$) is processed together with 7% of bisazide No. 1 into a 10% solution in 4-butyrolactone. The wafers are coated at 2,200 r.p.m. After drying at 20° C. it needs an exposure time of only 13 seconds to give crisp structures having a film thickness of 0.94 μm and a resolution of 3 μm. The images are developed with the following developing programme in a spray developer:

NMP: 14 seconds
NMP/toluene 1:1: 3 seconds
Toluene: 10 seconds

On heating to 400° C. the film thickness is still 0.80 μm. A 10 minutes treatment with hot NMP at 80° C. in an ultrasonic bath fails to produce a change in the shape or surface of the structures.

Example 14

A 6.0% solution is prepared of a polyimide prepared from benzophenonetetracarboxylic dianhydride and an isomeric mixture of 4,4'-diaminophenylmethane derivatives ethyl-substituted in the 2- or 2,2'-position ($\overline{M}_w=45,000$) in the presence of 7% of bisazide No. 1. The solution is filtered and the filtrate whirler-coated at 1,450 r.p.m. onto wafers. Drying is followed by a 13 second exposure and the following development programme:

NMP/toluene 80:20: 5 seconds
NMP/toluene 40:60: 3 seconds
Toluene: 10 seconds

This gives very crisp structures having a resolution of 2-3 μm and a film thickness of 0.98 μm.

On heating to 400° C. the film thickness is still 0.77 μm.

Example 15

A polyimide prepared from benzophenonetetracarboxylic dianhydride and 3,3'-dimethyl-4,4'-diaminodiphenylmethane and having an average molecular weight $\overline{M}_w=44,000$ is dissolved in 4-butyrolactone. The 7% solution is admixed with 7% of bisazide No. 1 and filtered through a 0.45 μm filter. At 23° C. the solution has a viscosity of 335 mPas. $SiO_2$-coated 3-inch wafers are coated at 2,350 r.p.m., and are dried at 60° C. for 17 minutes.

Developing follows the following programme:
Spray developer, 2 bar, 1,000 r.p.m.:
NMP/toluene 80:20: 5 seconds
NMP/toluene 40:60: 3 seconds
Toluene: 10 seconds A light output of 30 mW/cm² necessitates an exposure time of only 8 seconds (240 mJ/cm²) to give very crisp structures (2 μm resolution) which have a film thickness of 0.92 μm.

The wafers covered with photostructures are placed in an oven, heated to 400° C. in the course of 1 hour, left at that temperature for 15 minutes, and then cooled down.

A high-resolution microscope shows virtually no changes in structure, and the renewed measurement of the film thickness gives a value of 0.84 μm.

The heat-treated relief structures are finally exposed in an ultrasonic bath for 10 minutes to hot NMP at 80° C. After this treatment, the microscope shows no damage to the surface nor any geometrical deformation.

What is claimed is:

1. A radiation-sensitive coating agent comprising (a) an organic solvent, (b) a homopolyimide or copolyimide which is soluble in said solvent and is formed by reaction of aromatic tetracarboxylic acid dianhydrides with any one of aromatic diamines or aromatic/aliphatic diamines or diisocyanate derivatives of said diamines, where at least one aliphatic group is bonded directly or via a bridging group to at least one of the aromatic diamine radicals, or where at least one of said aromatic diamine radicals contains an alkylene, alkylidene, cycloalkylidene or Si (alkyl)₂ aliphatic bridging group, and admixed therewith (c) at least 0.1% by weight, based on component (b), of at least one organic chromophoric radiation sensitive polyazide in which the azide groups are bonded to aromatic hydrocarbon radicals.

2. A coating agent according to claim 1, wherein the polyimide or copolyimide contains at least 10 mol%, based on the polyimide, of radicals having aliphatic groups or bridging groups.

3. A coating agent according to claim 1, wherein the aliphatic group is alkyl-Q— in which there are 1 to 6 C atoms in the alkyl group and Q is a direct bond, —O—, —S—, —SO—, —SO₂—, —CO—, —NH—, —N-alkyl having 1–6 C atoms or —NHCO— and the bridging group is methylene, ethylene, ethylidene, 1,1- or 2,2-propylidene, 1,1- or 2,2-butylidene, cyclopentylidene, cyclohexylidene, Si(methyl)₂ or Si(ethyl)₂.

4. A coating agent according to claim 3, wherein the aliphatic group is methyl or methoxy and the bridging group is methylene, 2,2-propylidene or Si(methyl)₂.

5. A coating agent according to claim 1, in which homopolyimide or copolyimide (b) essentially consists of recurring structural units of the formula (I)

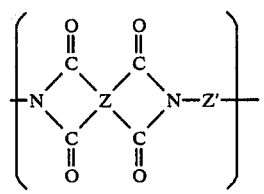

(I)

in which the four carbonyl groups are bonded to different carbon atoms and any two carbonyl groups are in ortho- or peri-position relative to each other, Z is a tetravalent radical which contains at least one aromatic ring and Z' is a divalent organic radical selected from among aromatic, alkylaromatic, aliphatic, cycloaliphatic and heterocyclic radicals, combinations thereof and radicals having oxygen-, sulfur-, nitrogen-, silicon- or phosphorus-containing bridging groups, with the proviso that (1) of the total number of recurring polyimide units
   (A) in 0 to 100 mol % of such units A is a phenylindane radical of the structural formula

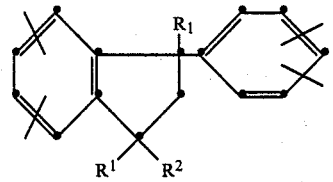

(II)

in which R₁ is hydrogen or an alkyl radical having 1 to 5 carbon atoms and R₂ is an alkyl radical having 1 to 5 carbon atoms, and (B) in 0 to 100 mol % of such units Z' is a phenylindane radical of the structural formula

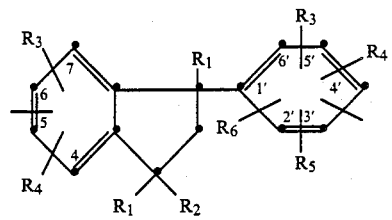

(III)

in which R₁ is hydrogen or an alkyl radical having 1 to 5 carbon atoms, R₂ is an alkyl radical having 1 to 5 carbon atoms, and R₃, R₄, R₅ and R₆ independently of one another are hydrogen, halogen, alkoxy or an alkyl radical having 1 to 4 carbon atoms and (2) of the total number of radicals Z and Z' at least 10 mol %, based on the individual components, are phenylindane radicals.

6. A coating agent according to claim 5, wherein R₂ in the formulae II and III is methyl.

7. A coating agent according to claim 5, wherein 0 to 100 mol % of the radicals Z are of the formula

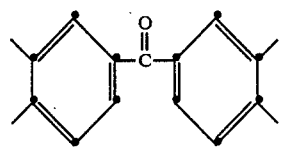

or the formula

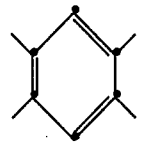

while 100 to 0 mol % of the radicals Z are a mixture of

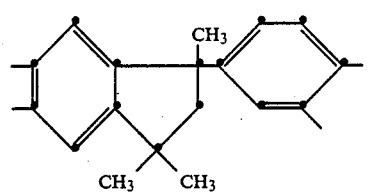

and

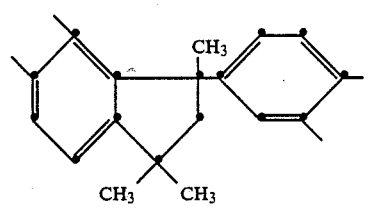

and in which 100 to 10 mol % of the radicals Z' correspond to formula III in which R₁, R₃, R₄, R₅ and R₆ independently of one another are hydrogen or methyl and R₂ is methyl, while 0 to 90 mol % of the radicals Z' have the formula

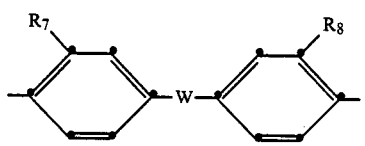

or

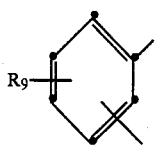

in which W is a covalent bond, methylene, ethylidene, 2,2-propylidene, cyclohexylidene, sulfur, oxygen or sulfone, $R_7$ and $R_8$ independently of each other are hydrogen, halogen, alkoxy or alkyl groups with 1 to 5 carbon atoms and $R_9$ is hydrogen, halogen, alkoxy or an alkyl group having 1 to 5 carbon atoms.

8. A coating agent according to claim 5, in which, in the polyimides, Z' is

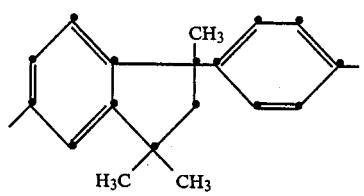

or

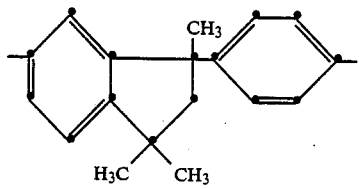

or a mixture thereof and Z is

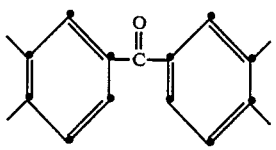

or

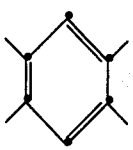

or a mixture thereof.

9. A coating agent according to claim 1, in which homopolyimide or copolyimide (b) essentially consists of recurring structural units of the formula (I)

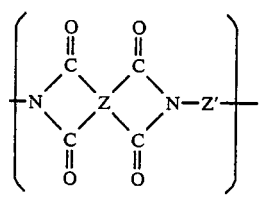

in which the four carbonyl groups are bonded to different carbon atoms and any two carbonyl groups are in ortho- or peri-position relative to each other, Z is a tetravalent radical which contains at least one aromatic ring and Z' is a divalent organic radical selected from among aromatic, alkylaromatic, aliphatic, cycloaliphatic and heterocyclic radicals, combinations thereof and radicals having oxygen-, sulfur-, nitrogen-, silicon-, or phosphorus-containing bridging groups, with the proviso that of the total number of recurring polyimide units, based on the tetracarboxylic anhydride radicals or diamine radicals, (A) 30–100 mol % of such units Z are benzophenonetetracarboxylic radicals and (B) 30–100 mol % of such units Z' are radicals of the formulae

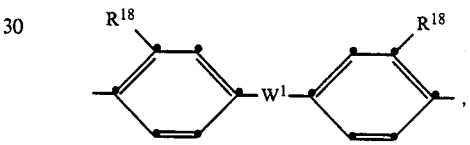

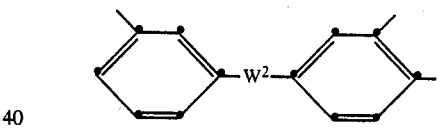

or

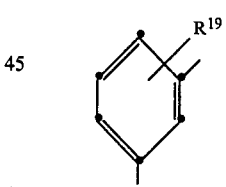

in which $W^1$ is $CH_2$, O, S, $SO_2$, CO or

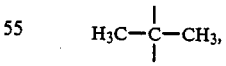

$W^2$ is $CH_2$, S, $SO_2$, CO or

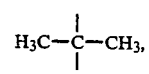

$R^{18}$ is alkyl or alkoxy having 1 to 6 C atoms, halogen, $CO_2H$, OH, $SO_3H$ or $NHCOCH_3$ and $R^{19}$ is alkyl having 1 to 6 C atoms, at least 10 mol % of these radicals being those which have $CH_2$,

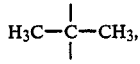

alkyl, alkoxy or NHCOCH3 groups.

10. A coating agent according to claim 9, in which $R^{18}$ and $R^{19}$ are methyl.

11. A coating agent according to claim 9, in which $W^1$ and $W^2$ are $CH_2$.

12. A coating agent according to claim 1, in which homopolyimide or copolyimide (b) essentially consists of recurring structural units of the formula (I)

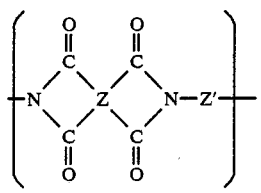

in which, based on the tetracarboxylic anhydride radicals or diamine radicals, (A) 75 to 100 mol % of the units Z are a pyromellitic anhydride radical and (B) 25 to 0 mol % of the units have the formula

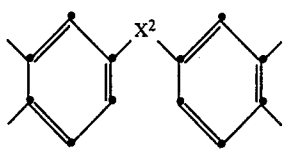

in which $X^2$ is O, $SO_2$ or, CO, and (C) 10 to 35 mol % of the units Z' have the formula

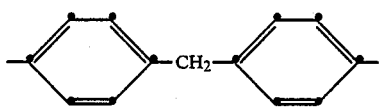

and 90 to 65 mol % of the units Z' have the formulae

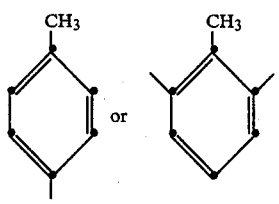

or mixtures thereof.

13. A coating agent according to claim 1, in which copolyimide (b) essentially consists of recurring structural units of the formula (I)

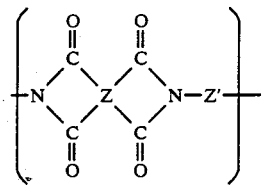

in which (A) Z is benzophenonetetracarboxylic dianhydride radical and (B) based on the diamine radicals, 10–30 mol % of the units Z' have the formula

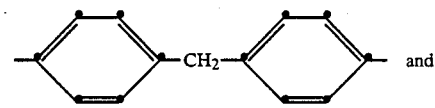

and (C) 90–70 mol % of the units Z'

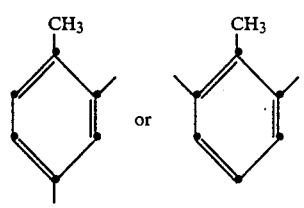

or mixtures thereof.

14. A coating agent according to claim 1, which contains 99.9 to 20% by weight of polyimide (b) and 0.1 to 20% by weight of bisazide (c), based on the components (b) and (c).

15. A coating agent according to claim 1, in which the solvent is a polar aprotic solvent.

16. A coating agent according to claim 1, in which the chromophoric polyazide is a diazide of the formula

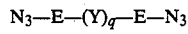

in which E is an aromatic hydrocarbon radical, q is 0 or 1 and Y is a group which forms a mesomeric system together with the aromatic hydrocarbon radicals E.

17. A coating agent according to claim 16, in which Y is O, CO, S, $SO_2$, NR' in which R' is hydrogen, alkyl, cycloalkyl, aryl or aralkyl,

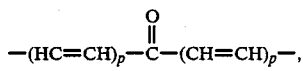

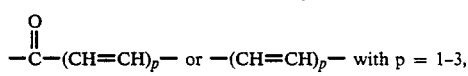

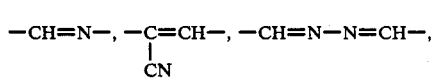

-continued

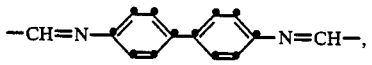

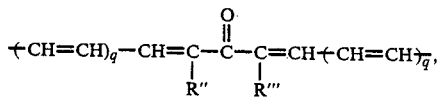

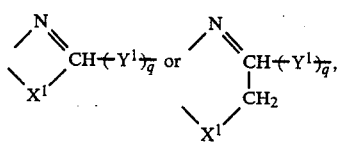

in which R" and R'" independently of each other are alkyl having 1 to 5 C atoms or R" and R'"together are unsubstituted or alkyl-, hydroxyalkyl-, alkoxy-, trialkylsilyl-, hydroxyl-, carboxyl-, alkoxycarbonyl-, amino-, alkylamino-, or dialkylamino-substituted ethylene or trimethylene, q is 0 or 1, $X^1$ is O, S or NH, $Y^1$ is independently defined in the same way as Y and free bonds on N and $X_1$ form a fused heterocyclic ring together with the group E.

18. A coating agent according to claim 5 in which the polyazide is 2,6-bis((4-p-azidophenyl)-methine)-cyclohexan-1-one.

19. A coating agent according to claim 7 in which the polyazide is 2,6-bis((4-p-azidophenyl)-methine)-cyclohexan-1-one.

20. A photographic recording material for relief images which comprises a substrate and a radiation-sensitive layer applied thereon which is a mixture of polyimide (b) and at least 0.1% by weight of (b) of polyazide (c) according to claim 1.

21. A method for preparing a photo-crosslinked coated substrate which comprises applying the radiation-sensitive coating of claim 1 to the surface of a substrate, removing the solvent and exposing said coating to high-energy radiation.

* * * * *